US 9,947,372 B2

(12) United States Patent
Kim et al.

(10) Patent No.: US 9,947,372 B2
(45) Date of Patent: Apr. 17, 2018

(54) SEMICONDUCTOR DEVICE MANAGING POWER BUDGET USING BI-DIRECTIONAL RING STRUCTURE AND OPERATING METHOD THEREOF

(71) Applicants: SK hynix Inc., Icheon (KR); INDUSTRY-ACADEMIC COOPERATION FOUNDATION, YONSEI UNIVERSITY, Seoul (KR)

(72) Inventors: Myeongjin Kim, Seoul (KR); Sang-Woo Han, Seoul (KR); Eui-Young Chung, Seongnam (KR)

(73) Assignees: SK HYNIX INC., Icheon (KR); INDUSTRY-ACADEMIC COOPERATION FOUNDATION YONSEI UNIVERSITY, Seoul (KR)

(*) Notice: Subject to any disclaimer, the term of this patent is extended or adjusted under 35 U.S.C. 154(b) by 242 days.

(21) Appl. No.: 14/809,044

(22) Filed: Jul. 24, 2015

(65) Prior Publication Data
US 2016/0291658 A1   Oct. 6, 2016

(30) Foreign Application Priority Data
Mar. 30, 2015   (KR) .................. 10-2015-0043886

(51) Int. Cl.
| | | |
|---|---|---|
| *G11C 5/14* | (2006.01) | |
| *G06F 1/26* | (2006.01) | |
| *G06F 13/40* | (2006.01) | |
| *H04L 12/46* | (2006.01) | |
| *H04L 12/54* | (2013.01) | |

(52) U.S. Cl.
CPC .................. *G11C 5/14* (2013.01); *G06F 1/26* (2013.01); *G06F 13/4068* (2013.01); *H04L 12/4637* (2013.01); *H04L 12/56* (2013.01)

(58) Field of Classification Search
CPC ....... G11C 5/14; H04L 12/4637; H04L 12/56; G06F 1/26; G06F 13/4068
See application file for complete search history.

(56) References Cited

U.S. PATENT DOCUMENTS 4,752,924 A * 6/1988 Darnell .................. H04L 12/56
340/2.9
5,289,467 A * 2/1994 Kartalopoulos .... H04L 12/4637
370/406

(Continued)

FOREIGN PATENT DOCUMENTS

KR   10-2014-0006344 A   1/2014

*Primary Examiner* — Ajay Ojha

(57) ABSTRACT

A semiconductor device includes a plurality of chips including first and second chips, each of the first and second chips including a first input terminal receiving a first token input signal, a first output terminal outputting a first token output signal, a second input terminal receiving a second token input signal, and a second output terminal outputting a second token output signal. The first and second chips are coupled to each other in a bi-directional ring structure such that the first output terminal of the first chip is coupled to the first input terminal of the second chip and the second output terminal of the second chip is coupled to the second input terminal of the first chip. Each of the first and second chips performs a corresponding peak zone operation according to the first token input signal and the second token input signal.

17 Claims, 6 Drawing Sheets

(56) References Cited

U.S. PATENT DOCUMENTS

| | | | | |
|---|---|---|---|---|
| 5,400,323 | A | * 3/1995 | Frenzel, III | H04L 12/437 370/434 |
| 8,572,423 | B1 | 10/2013 | Isachar et al. | |
| 8,645,723 | B2 | 2/2014 | Seroff | |
| 2010/0174927 | A1 * | 7/2010 | Kim | G06F 1/266 713/300 |
| 2014/0010033 | A1 * | 1/2014 | Won | G11C 5/14 365/227 |

* cited by examiner

SEMICONDUCTOR DEVICE MANAGING POWER BUDGET USING BI-DIRECTIONAL RING STRUCTURE AND OPERATING METHOD THEREOF

The present application claims priority under 35 U.S.C. § 119(a) to Korean Patent Application Number 10-2015-0043886, filed on Mar. 30, 2015, in the Korean Intellectual Property Office, which is incorporated herein by reference in its entirety as set forth in full.

BACKGROUND

1. Technical Field

Embodiments of the present disclosure relate to a semiconductor device that manages power budget and an operation method thereof. Particularly, embodiments of the present disclosure relate to a semiconductor device that manages power budget based on a token, and an operation method thereof.

2. Related Art

According to an operation type of a semiconductor device, an instantaneous current may have a magnitude, which is greater than that of an average current corresponding to average power consumption of the semiconductor device during a period to perform a certain operation.

Such a period is called a peak zone (PKZ), and such an operation is called a peak zone operation.

When a semiconductor device includes several chips and the several chips try to simultaneously perform peak zone operations, an operation failure may occur in the semiconductor device due to excessive current consumption.

In order to prevent such a failure, a power budget technology has been introduced. For example, a conventional semiconductor device disclosed in KR10-2014-0006344A uses a token for managing power budget.

However, the conventional semiconductor device disclosed in KR10-2014-0006344A includes a plurality of chips having a single directional ring structure, and thus a peak zone operation in a chip is not performed until a sufficient amount of a token is collected by that chip.

Therefore, in the single directional ring structure, when a first chip waits without performing a first peak zone operation to collect a sufficient amount of a token, even though a second chip, which is a next chip of the first chip, has collected a token with a sufficient amount to perform a second peak zone operation, the second chip also waits without performing the second peak zone operation. As a result, the operational performance of the conventional semiconductor device is degraded. Such a performance degradation issue may become more significant when there is an operation with a high priority to be performed in the second chip.

SUMMARY

A semiconductor device capable of improving operational performance and optimizing peak current consumption, and an operation method thereof are described herein.

In an embodiment of the present disclosure, a semiconductor device includes a plurality of chips including first and second chips, each of the first and second chips including a first input terminal receiving a first token input signal, a first output terminal outputting a first token output signal, a second input terminal receiving a second token input signal, and a second output terminal outputting a second token output signal, wherein the first and second chips are coupled to each other in a bi-directional ring structure such that the first output terminal of the first chip is coupled to the first input terminal of the second chip and the second output terminal of the second chip is coupled to the second input terminal of the first chip, each of the first and second chips performing a corresponding peak zone operation according to the first token input signal and the second token input signal.

In an embodiment of the present disclosure, an operating method of a semiconductor device, in which a plurality of chips including a first chip and a second chip are coupled to one another in a bi-directional ring structure, includes: a first step of comparing a token available in the first chip with a token required in a peak zone operation of the first chip in which a maximum instantaneous current is consumed; a second step of comparing the token available in the first chip with a token required in the peak zone operation of the second chip when the token available in the first chip is smaller than the token required in the peak zone operation of the first chip; and a third step of providing the token of the first chip to the second chip and performing the peak zone operation of the second chip when the token available in the first chip is larger than the token required in the peak zone operation of the second chip.

In an embodiment of the present disclosure, an operating method of a semiconductor device, in which a plurality of chips including a first chip and a second chip are coupled to one another in a bi-directional ring structure, includes: comparing an amount of an available token in the first chip with an amount of a required token to perform a first peak zone operation of the first chip; comparing the amount of the available token in the first chip with an amount of a required token to perform a second peak zone operation of the second chip when the available token in the first chip is less than the required token to perform the first peak zone operation of the first chip; and transferring a portion of the amount of the available token of the first chip to the second chip and performing the second peak zone operation of the second chip when the amount of the available token in the first chip is greater than the amount of the required token to perform the second peak zone operation of the second chip.

According to an embodiment of the present disclosure, peak current consumption is optimized and simultaneously a waiting time is minimized in chips of a semiconductor device, so that it is possible to improve the performance of the semiconductor device.

Furthermore, according to an embodiment, peak current consumption is optimized and simultaneously an operation with a high priority is first performed in chips of the semiconductor device, so that it is possible to improve the performance of the semiconductor device.

BRIEF DESCRIPTION OF THE DRAWINGS

Features, aspects, and embodiments are described in conjunction with the attached drawings, in which.

DETAILED DESCRIPTION

Hereinafter, a semiconductor device and an operation method thereof according to embodiments will be described in detail with reference to the accompanying drawings.

Figure 1:
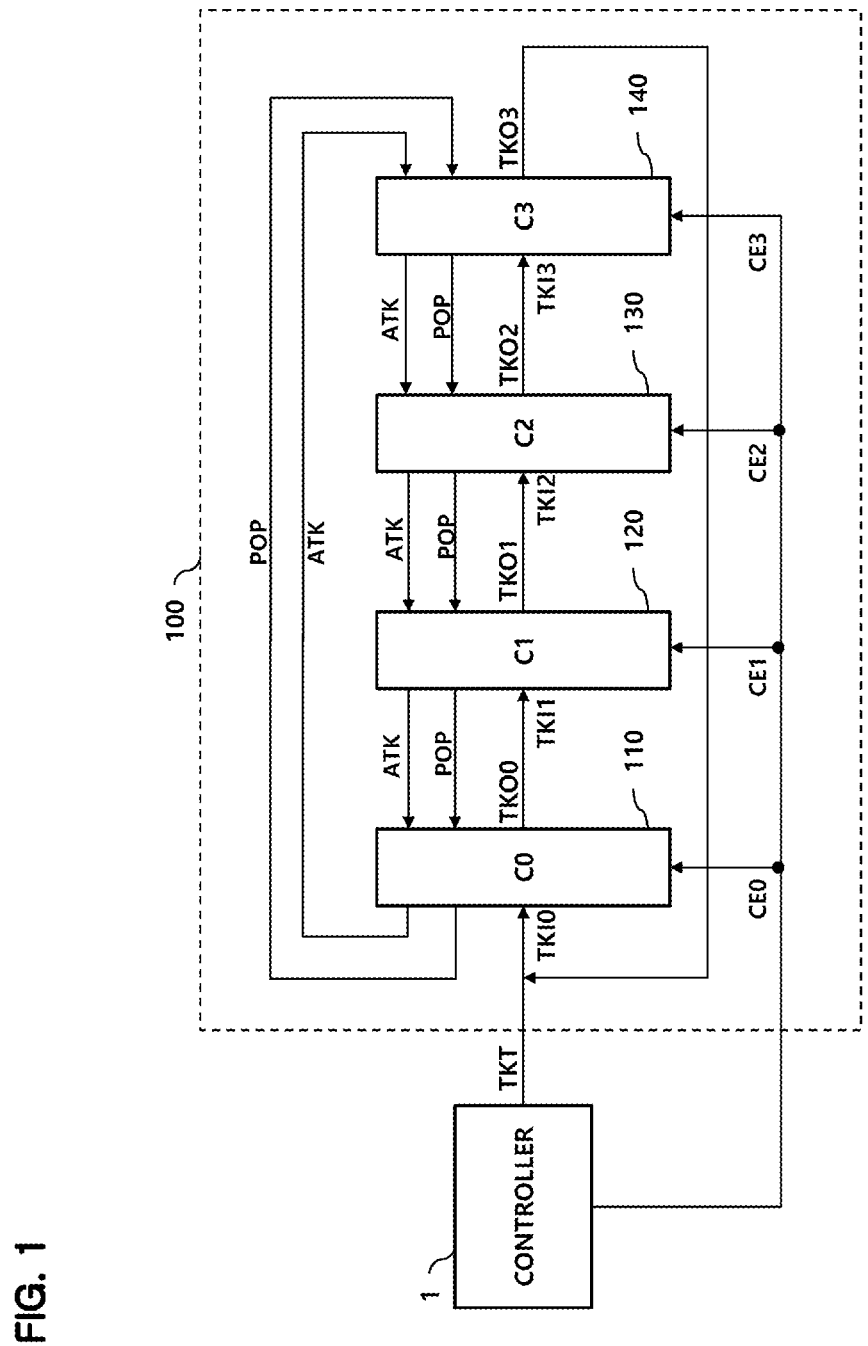
FIG. 1 is a block diagram of a semiconductor device according to an embodiment.

FIG. 1 is a block diagram of a semiconductor device 100 according to an embodiment.

The semiconductor device 100 includes a plurality of chips.

In the embodiment shown in FIG. 1, four chips 110, 120, 130, and 140 are shown, however, embodiments of the present disclosure are not limited thereto. In other embodiments, a different number of chips may be included in the semiconductor device 100.

Each of the plurality of chips 110, 120, 130, and 140 receives a corresponding one of token input signals (or first token input signals) TKI0, TKI1, TKI2, and TKI3 each indicative of a token in order to perform a corresponding peak zone operation. As used in this disclosure, the term 'token' and similar terms indicate authorization to perform a peak zone operation. For example, when a chip receives a signal indicative of a token and an amount of the received token is equal to or greater than a threshold value, the chip can perform a peak zone operation. However, one of skilled in the art will understand that such references are merely for convenience of description and are not intended to limiting. In an embodiment, each of the plurality of chips 110, 120, 130, and 140 has a first input terminal that receives the corresponding token input signal TKI0, TKI1, TKI2, or TKI3.

Each of the plurality of chips 110, 120, 130, and 140 outputs a corresponding token output signal TKO0, TKO1, TKO2, or TKO3. In an embodiment, each of the plurality of chips 110, 120, 130, and 140 has a first output terminal that outputs the corresponding token output signal TKO0, TKO1, TKO2, or TKO3.

The plurality of chips 110, 120, 130, and 140 are coupled in a ring structure, such that each of the token output signals TKO0, TKO1, TKO2, and TKO3 output from a current chip (or a first chip) is input to a next chip (or a second chip). As used in this disclosure, the term 'current chip' and similar terms indicate a chip that is determined to perform a peak zone operation at a point in time. The term 'next chip' and similar terms indicate a chip that is coupled to the current chip in the direction of outputting the token output signal and receives a token output signal of the current chip as a token input signal. For example, in FIG. 1, when the first chip 110 is the current chip, the second chip 120 is the next chip.

The total amount TKT of a token available in the semiconductor device 100 may be provided from an external device. In an embodiment, the term 'amount of a token' and similar terms indicate the magnitude of a current to perform a corresponding peak zone operation in the semiconductor device 100. However, one of skilled in the art will understand that such references are merely for convenience of description and are not intended to limiting.

In the embodiment shown in FIG. 1, a signal indicative of the total amount TKT of the available token in the semiconductor device 100 may be input to the first chip 110 from a controller 1 outside the semiconductor device 100 at the beginning of an operation.

In addition, the controller 1 may provide chip enable signals CE0 to CE3 to the first chip 110 to the fourth chip 140, respectively, to activate the corresponding chips 110 to 140.

The plurality of chips 110, 120, 130, and 140 are coupled to one another in a bi-directional structure, rather than the single directional structure of the conventional semiconductor device.

The token input signals TKI0 to TKI3 and token output signals TKO0 to TKO3 are circulated in a first direction, e.g., in a sequence of the first chip 110, the second chip 120, the third chip 130, the fourth chip 140, and the first chip 110. Hereinafter, a token transferred in the first direction may be called a first token signal.

Furthermore, a required token signal ATK (or a second token input signal) and a priority signal POP are circulated in a second direction, e.g., in a sequence of the fourth chip 140, the third chip 130, the second chip 120, the first chip 110, and the fourth chip 140. Hereinafter, a required token signal transferred in the second direction may be called a second token signal. In an embodiment, each of the plurality of chips 110, 120, 130, and 140 has a second input terminal that receives a required token signal ATK indicating an amount of a required token in a next chip from the next chip and a second output terminal that outputs a required token signal ATK indicating an amount of a required token in a current chip to a previous chip. For example, the second chip 120 receives a required token signal ATK indicating an amount of a required token in the third chip 130 from the third chip 130 and outputs a required token signal ATK indicating an amount of a required token in the second chip 120 to the first chip 110.

For example, when the required token signal ATK has a value of 0 associated with the operation in the next chip, it may indicate that the operation in the next chip does not require a token, that is, the operation in the next chip is not a peak zone operation. For example, when the required token signal ATK has a positive value associated with the operation in the next chip, it may indicate that the operation in the next chip is a peak zone operation and the positive value corresponds to the amount of the required token to perform the peak zone operation.

The priority signal POP indicates a priority of an operation to be performed in the next chip, particularly, a peak zone operation. In an embodiment, each of the plurality of chips 110, 120, 130, and 140 has a third input terminal that receives a priority signal POP from a next chip and a third output terminal that outputs a priority signal POP to a previous chip.

For example, the current chip may compare a priority of an operation to be performed in the next chip indicated by the priority signal POP with a priority of an operation to be performed in the current chip, thereby determining which operation has a higher priority.

In the embodiment shown in FIG. 1, even though an amount of an available token in a current chip is not sufficient to perform a peak zone operation of the current chip, when the amount of the available token in the current chip is sufficiently large to perform a peak zone operation of a next chip, the current chip transfers at least a portion of the available token to the next chip, rather than waiting until the amount of the available token in the current chip becomes sufficiently large to perform the peak zone operation of the current chip. As a result, the peak zone operation of the next chip can be performed without a delay associated with the waiting of the current chip, such that it is possible to reduce performance degradation of the semiconductor device 100 including the current and next chips.

Furthermore, in the embodiment shown in FIG. 1, when a peak zone operation in the next chip has a higher priority than that of the current chip, the peak zone operation of the next chip may be performed prior to the peak zone operation of the current chip, such that it is possible to reduce performance degradation of the semiconductor chip 100.

Accordingly, the current chip is desirable to receive information regarding whether an operation to be performed in the next chip requires a token, information regarding whether the operation in the next chip has a priority over the operation in the current chip, or both.

Accordingly, the embodiment shown in FIG. 1 further includes a link transferring the aforementioned information in the second direction that is opposite to the first direction in which the token input signals TKI0 to TKI3 and token output signals TKO0 to TKO3 are transferred.

Operations of the semiconductor device 100 according to an embodiment will be described with reference to FIG. 2 and FIG. 3.

Figure 2:
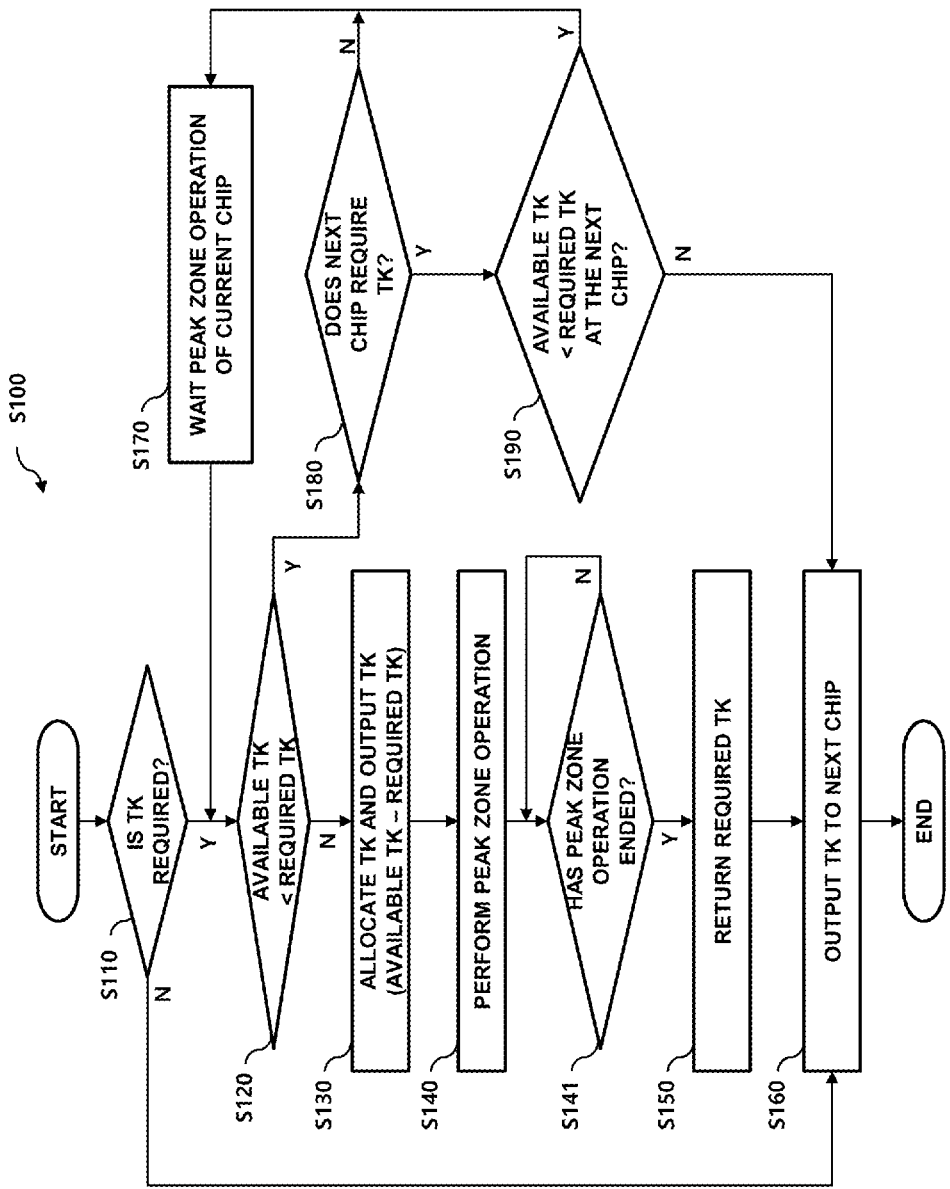
FIG. 2 and FIG. 3 are flowcharts illustrating operations of the semiconductor device of FIG. 1.

FIG. 2 is a flowchart illustrating an operation process of the semiconductor device 100 of FIG. 1 according to an embodiment.

At S110, the semiconductor device 100 determines whether an operation to be performed in a current chip requires a token. For example, a peak zone operation, such as a reading operation, a writing operation, or the like, requires a token.

If it is determined that the operation of the current chip does not require a token, at S160, the semiconductor device 100 transfers the token to a next chip, and the current chip ends a token management operation.

On the other hand, if it is determined that the operation (e.g., a peak zone operation) of the current chip requires the token, at S120, the semiconductor device 100 determines whether an amount of a token available in the current chip is smaller than an amount of a required token to perform the peak zone operation of the current chip.

If it is determined that the amount of the token available in the current chip is equal to or greater than the amount of the required token, at S130, the semiconductor device 100 allocates the amount of the required token to perform the peak zone operation of the current chip. The current chip outputs a signal indicative of a token, which has an amount corresponding to that obtained by subtracting the amount of the required token from the amount of the available token, to the next chip.

Then, at S140, the current chip performs the peak zone operation corresponding to the allocated token.

If it is determined at S141 that the peak zone operation of the current chip is ended, the current chip returns the token used to perform the peak zone operation at S150, and transfers the returned token to the next chip at S160.

If it is determined at S120 that the amount of the required token to perform the peak zone operation of the current chip is greater than the amount of the available token in the current chip, at S180, the semiconductor device 100 determines whether an operation of the next chip requires a token.

If it is determined that the operation of the next chip does not require the token, the current chip waits until the amount of the available token becomes equal to or greater than that of the required token to perform the peak zone operation at S170, and then the operation process returns to S120.

On the other hand if it is determined at S180 that the operation of the next chip requires the token, at S190, the semiconductor device 100 determines whether an amount of the required token in the next chip is greater than that of the available token in the current chip.

If it is determined at S190 that the amount of the required token in the next chip is equal to or less than the available token in the current chip, at S160, the semiconductor device 100 outputs a signal indicative of the amount of the available token in the current chip to the next chip, and ends the token management operation of the current chip.

If it is determined at S190 that the amount of the required token in the next chip is greater than the amount of the available token in the current chip, the current chip waits until the amount of the available token becomes equal to or greater than that of the required token to perform the peak zone operation at S170, and then the operation process returns to S120. In the embodiment of FIG. 2, the above steps of the operation process may be performed by the current chip.

As described in the embodiment of FIG. 2, even though the amount of the available token in the current chip is not sufficient to perform a peak zone operation of the current chip, if the amount of the available token in the current chip is sufficiently large to perform a peak zone operation of the next chip, the current chip transfers the available token to the next chip rather than waiting until the amount of the available token becomes sufficient to perform the peak zone operation of the current chip. As a result, performance degradation of the semiconductor device 100 is reduced.

Figure 3:
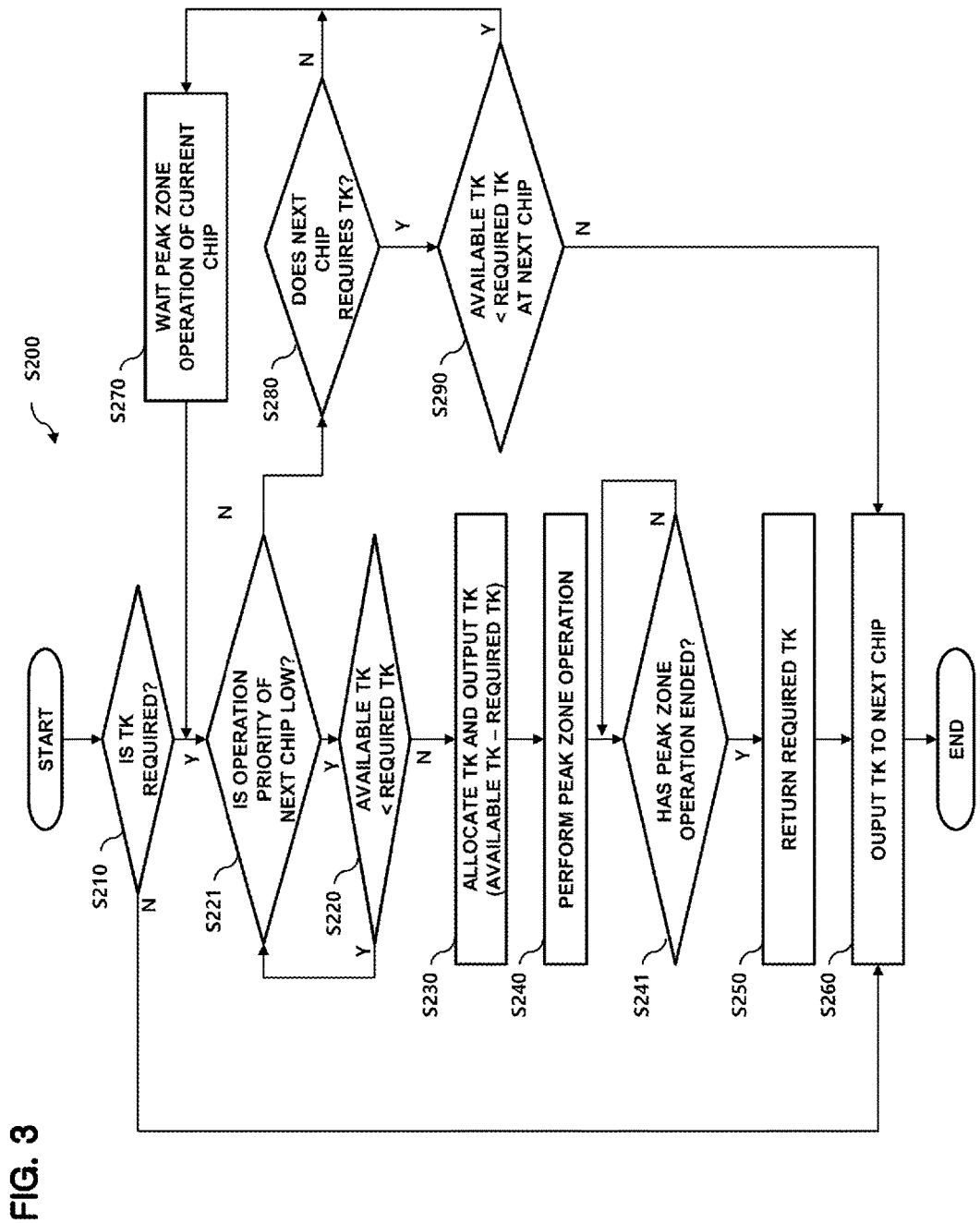

FIG. 3 is a flowchart illustrating another operation process of the semiconductor device 100 of FIG. 1 according to an embodiment.

At S210, the semiconductor device 100 determines whether an operation to be performed in a current chip requires a token. For example, a peak zone operation, such as a reading operation, a writing operation, or the like, requires a token.

If it is determined that the operation of the current chip does not require a token, at S260, the semiconductor device 100 transfers the token to a next chip, and the current chip ends a token management operation.

On the other hand, if it is determined that the operation (e.g., a peak zone operation) of the current chip requires the token, at S221, the semiconductor device 100 determines whether a priority of an operation of the next chip is lower than that of the peak zone operation of the current chip.

When the priority of the operation of the next chip is lower than that of the peak zone operation of the current chip, at S220, the semiconductor device 100 determines whether an amount of a token available in the current chip is smaller than that of a required token to perform the peak zone operation of the current chip.

If it is determined that the amount of the token available in the current chip is equal to or greater than the amount of the required token, at S230, the semiconductor device 100 allocates the required token to perform the peak zone operation of the current chip. The current chip outputs a signal indicative of a token, which has an amount corresponding to that obtained by subtracting the amount of the required token from the amount of the available token in the current chip, to the next chip.

Then, at S240, the current chip performs the peak zone operation corresponding to the allocated token.

If it is determined at S241 that the peak zone operation of the current chip is ended, the current chip returns the token used to perform the peak zone operation at S250 and transfers the returned token to the next chip at S260.

As a result of the determination at S220, when the amount of the required token to perform the peak zone operation of the current chip is greater than the available token in the current chip, the operation process proceeds to S221.

As a result of the determination at S221, when the priority of the operation of the next chip is equal to or higher than that of the peak zone operation of the current chip, at S280, the semiconductor device 100 determines whether the operation of the next chip requires a token. In an embodiment, at S280, the semiconductor device 100 determines whether the operation of the next chip requires a token when the priority of the operation of the next chip is higher than that of the peak zone operation of the current chip.

If it is determined that the operation of the next chip does not require the token, the current chip waits until the amount of the available token becomes equal to or greater than that of the required token to perform the peak zone operation of the current chip at S270, and then the operation process returns to S221.

On the other hand if it is determined that the operation of the next chip requires the token, at S290, the semiconductor device 100 determines whether the amount of the required token in the next chip is greater than that of the available token in the current chip.

If it is determined at S290 that the amount of the required token in the next chip is equal to or less than the available token in the current chip, at S260, the semiconductor device 100 outputs a signal indicative of the amount of the available token in the current chip to the next chip, and ends the token management operation of the current chip.

On the other hand, if it is determined at S290 that the amount of the required token in the next chip is greater than the amount of the available token in the current chip, the current chip waits until the amount of the available token becomes equal to or greater than that of the required token to perform the peak zone operation of the current chip at S270, and then the operation process returns to S221. In the embodiment of FIG. 3, the above steps of the operation process may be performed by the current chip.

As described in the embodiment of FIG. 3, when a peak zone operation of the next chip has a priority higher than that of an operation in the current chip, the peak zone operation of the next chip may be performed prior to the operation of the current chip, so that the performance of the semiconductor device 100 is improved.

Figure 4:
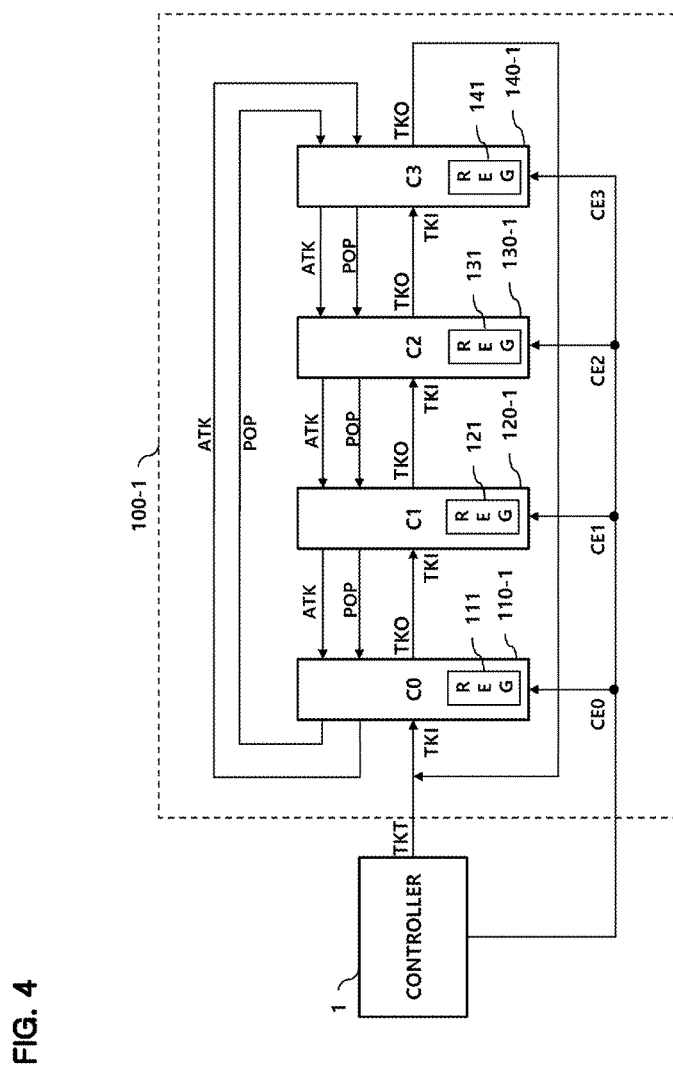
FIG. 4 is a block diagram of a semiconductor device according to an embodiment.

FIG. 4 is a block diagram of a semiconductor device 100-1 according to an embodiment.

The embodiment of FIG. 4 differs from the embodiment of FIG. 1 in a configuration of each chip. In FIG. 4, first, second, third, and fourth chips 110-1, 120-1, 130-1, and 140-1 further include first, second, third, and fourth registers 111, 121, 131, and 141, respectively. Other elements of the embodiment shown in FIG. 4 perform similar functions to those of corresponding elements of the embodiment shown in FIG. 1, and thus operations of the other elements are omitted herein in the interest of brevity.

Each of the first, second, third, and fourth registers 111, 121, 131, and 141 stores a number of times of transferring tokens from the current chip to a next chip during a time period in which the current chip waits to perform a peak zone operation.

For example, during the time period in which the current chip continuously waits until a total amount of the available token in the current chip becomes sufficiently large to perform a peak zone operation of the current chip, if all the received tokens by the current chip are transferred from the current chip to the next chip, a waiting time of the current chip to perform the peak zone operation would increase. As a result, the increase of the waiting time may cause deterioration of the performance of the current chip. Hereinafter, for illustrative convenience, an operation of transferring a token from the current chip to the next chip may be referred to as a 'bypass operation.'

In order to address such an issue, in the embodiment of FIG. 4, the numbers of bypass operations performed by the chips 110-1, 120-1, 130-1, and 140-1 are stored in the registers 111, 121, 131, and 141, respectively. When the number of bypass operations in a corresponding one of the chips 110-1, 120-1, 130-1, and 140-1 reaches a predetermined number, the corresponding chip stops bypassing any available token to the next chip.

In the embodiment of FIG. 4, the registers 111, 121, 131, and 141 are respectively included in the corresponding chips 110-1, 120-1, 130-1, and 140-1, but embodiments are not limited thereto. In another embodiment, the registers 111, 121, 131, and 141 may be positioned outside the chips 110-1, 120-1, 130-1, and 140-1.

Figure 5:
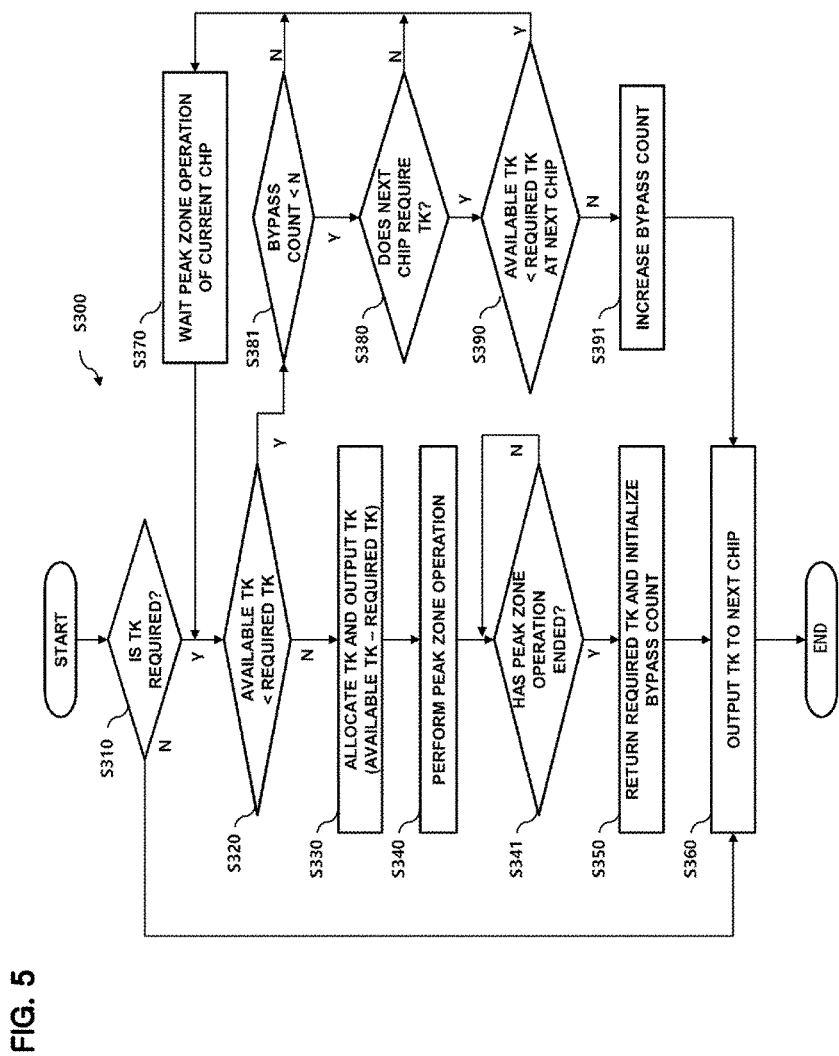
FIG. 5 and FIG. 6 are flowcharts illustrating operations of the semiconductor device of FIG. 4.

FIG. 5 is a flowchart illustrating an operation process of the semiconductor device 100-1 of FIG. 4 according to an embodiment.

At S310, the semiconductor device 100-1 determines whether an operation to be performed in a current chip requires a token. For example, a peak zone operation, such as a reading operation, a writing operation, or the like, requires a token.

If it is determined that the operation of the current chip does not require a token, at S360, the semiconductor device 100-1 transfers the token to a next chip, and the current chip ends a token management operation.

If it is determined that the operation (e.g., a peak zone operation) of the current chip requires the token, at S320, the semiconductor device 100-1 determines whether an amount of a token available in the current chip is smaller than an amount of a required token to perform the peak zone operation of the current chip.

If it is determined that the amount of the token available in the current chip is equal to or greater than the amount of the required token, at S330, the semiconductor device 100-1 allocates the required token to perform the peak zone operation of the current chip. In addition, at S330, the current chip outputs a signal indicative of a token, which has an amount corresponding to that obtained by subtracting the amount of the required token from the amount of the available token, to the next chip.

Then, at S340, the current chip performs the peak zone operation corresponding to the allocated token.

If it is determined at S341 that the peak zone operation of the current chip is ended, the current chip returns the token used to perform the peak zone operation and initializes the number of bypass operations of the current chip at S350.

After that, at S360, the current chip transfers the returned token to the next chip.

As a result of the determination at S320, when the amount of the required token to perform the peak zone operation of the current chip is greater than the amount of the available token in the current chip, the semiconductor device 100-1 determines whether the number of bypass operations of the current chip is smaller than a predetermined number at S381.

When the number of bypass operations of the current chip reaches the predetermined number, the current chip waits until the amount of the available token becomes equal to or greater than that of the required token to perform the peak zone operation at S370, and then the operation process returns to S320.

On the other hand, when the number of bypass operations of the current chip is determined to be smaller than the predetermined number, the semiconductor device 100-1 determines whether an operation of the next chip requires a token at S380.

If it is determined that the operation of the next chip does not require a token, the current chip waits until the amount of the available token becomes equal to or greater than that of the required token to perform the peak zone operation at S370, and then the operation process returns to S320.

If it is determined that the operation of the next chip requires the token, at S390, the semiconductor device 100-1 determines whether the amount of the required token in the next chip is greater than that of the available token in the current chip.

If it is determined that the amount of the required token in the next chip is equal to or less than the available token in the current chip, the semiconductor device 100-1 increases the number of bypass operations of the current chip by one at S391, outputs a signal corresponding to the token input signal received by the current chip to the next chip at S360, and then ends the token management operation of the current chip. In an embodiment, when the amount of the required token in the next chip is equal to or less than the available token in the current chip, the semiconductor device 100-1 increases the number of bypass operations of the current chip by one at S391 and transfers at least a portion of the available token in the current chip to the next chip.

If it is determined at S390 that the amount of the required token in the next chip is greater than the amount of the available token in the current chip, the current chip waits until the amount of the available token becomes equal to or greater than that of the required token to perform the peak zone operation of the current chip at S370, and then the operation process returns to S320. In the embodiment of FIG. 5, the above steps of the operation process may be performed by the current chip.

Figure 6:
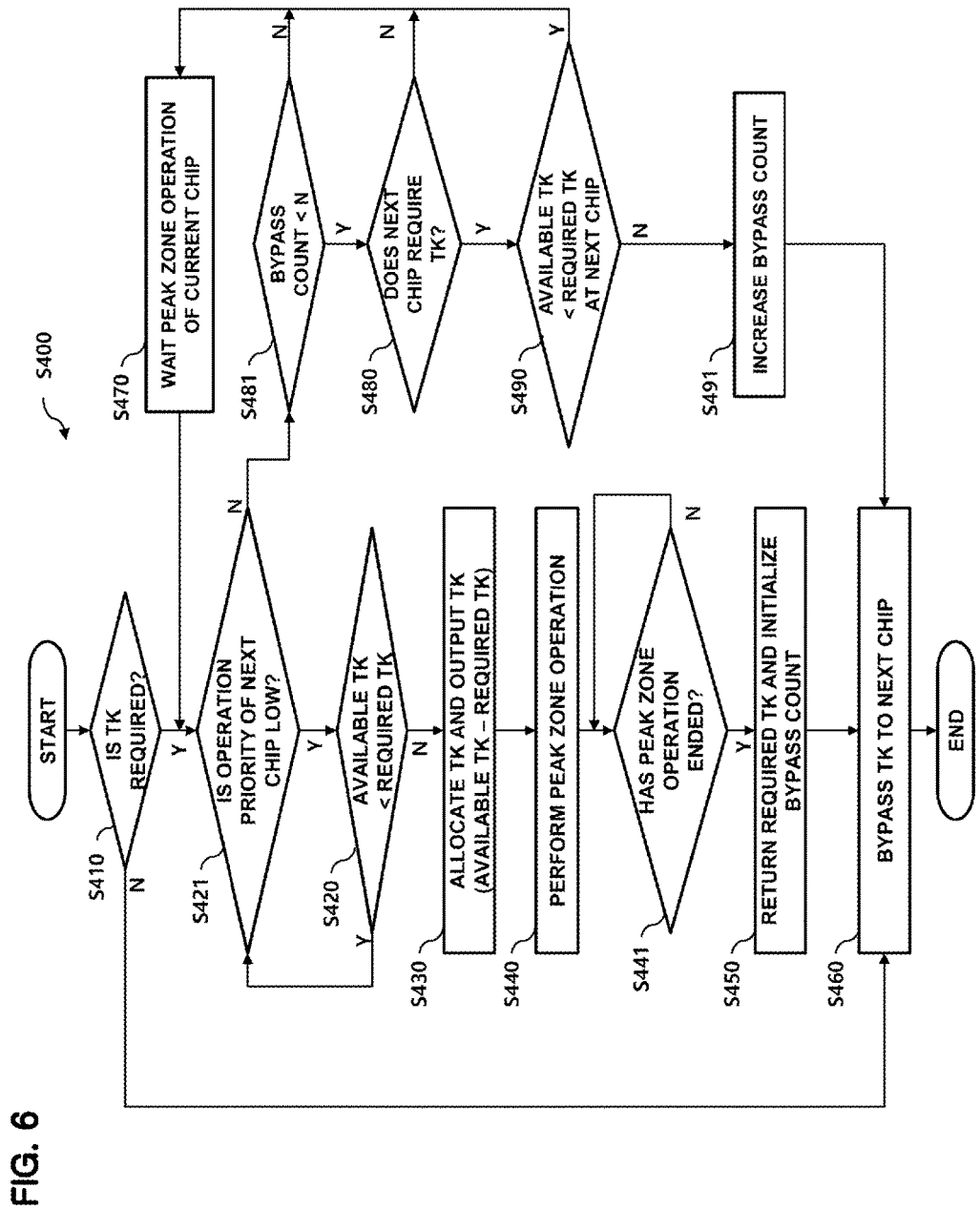

FIG. 6 is a flowchart illustrating another operation process of the semiconductor device 100-1 of FIG. 4 according to an embodiment.

At S410, the semiconductor device 100-1 determines whether an operation to be performed in a current chip requires a token. For example, a peak zone operation, such as a reading operation, a writing operation, or the like, requires a token.

If it is determined that the operation of the current chip does not require a token, at S460, the semiconductor device 100-1 transfers the token to a next chip, and the current chip ends a token management operation.

If it is determined that the operation (e.g., a peak zone operation) of the current chip requires the token, at S421, the semiconductor device 100-1 determines whether a priority of an operation of the next chip is lower than that of the peak zone operation of the current chip.

When the priority of the operation of the next chip is lower than that of the peak zone operation of the current chip, at S420, the semiconductor device 100-1 determines whether an amount of a token available in the current chip is smaller than that of a required token to perform the peak zone operation of the current chip.

If it is determined that the amount of the token available in the current chip is equal to or greater than the amount of the required token, at S430, the semiconductor device 100-1 allocates the required token to perform the peak zone operation of the current chip. The current chip outputs a signal indicative of a token, which has an amount corresponding to that obtained by subtracting the amount of the required token from the amount of the available token in the current chip, to the next chip.

Then, at S440, the current chip performs the peak zone operation corresponding to the allocated token.

If it is determined at S441 that the peak zone operation of the current chip is ended, at S450, the current chip returns the token used to perform the peak zone operation, and initializes the number of bypass operations of the current chip.

At S460, the current chip transfers the returned token to the next chip.

As a result of the determination at S420, when the amount of the required token to perform the peak zone operation of the current chip is greater than the available token in the current chip, the operation process proceeds to S421.

As a result of the determination at S421, when the priority of the operation of the next chip is equal to or higher than that of the peak zone operation of the current chip, at S481, the semiconductor device 100-1 determines whether the number of bypass operations of the current chip is smaller than a predetermined number. In an embodiment, the semiconductor device 100-1 determines whether or not the number of bypass operations of the current chip is smaller than the predetermined number when the priority of the operation of the next chip is higher than that of the peak zone operation of the current chip at S421.

If the number of bypass operations of the current chip reaches the predetermined number, the current chip waits until the amount of the available token becomes equal to or greater than that of the required token to perform the peak zone operation of the current chip at S470, and then the operation process returns to S421.

If it is determined that the number of bypass operations of the current chip is smaller than the predetermined number, the semiconductor device 100-1 determines whether an operation of the next chip requires a token at S480.

If it is determined that the operation of the next chip does not require a token, the current chip waits until the amount of the available token becomes equal to or greater than that of the required token to perform the peak zone operation at S470, and then the operation process returns to S421.

On the other hand, if it is determined that the operation of the next chip requires the token, at S490, the semiconductor device 100-1 determines whether the amount of the required token in the next chip is greater than that of the available token in the current chip.

If it is determined that the amount of the required token in the next chip is equal to or less than the available token in the current chip, the semiconductor device 100-1 increases the number of bypass operations of the current chip by one at S491, outputs a signal corresponding to the token input signal received by the current chip to the next chip at S460, and then ends the token management operation of the current chip. In an embodiment, when it is determined that the amount of the required token in the next chip is equal to or less than the available token in the current chip, the semiconductor device 100-1 increases the number of bypass operations of the current chip by one at S491 and transfers at least a portion of the available token in the current chip. In the embodiment of FIG. 6, the above steps of the operation process may be performed by the current chip.

The semiconductor devices 100 and 100-1 of FIG. 1 and FIG. 4 include memory devices. In an embodiment, the semiconductor devices 100 and 100-1 include NAND flash memory devices.

Furthermore, the chips included in the semiconductor devices 100 and 100-1 may include memory chips or NAND flash memory chips.

Furthermore, the controllers 1 shown in FIGS. 1 and 4 may include a memory controller that controls the memory device.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. A semiconductor device comprising:
a plurality of chips including first and second chips, each of the first and second chips including a first input terminal receiving a first token input signal, a first output terminal outputting a first token output signal, a second input terminal receiving a second token input signal, and a second output terminal outputting a second token output signal,
wherein the first and second chips are coupled to each other in a bi-directional ring structure such that the first output terminal of the first chip is coupled to the first input terminal of the second chip and the second output terminal of the second chip is coupled to the second input terminal of the first chip, each of the first and second chips performing a corresponding peak zone operation according to the first token input signal and the second token input signal,
wherein the first chip waits until an amount of an available token in the first chip becomes sufficiently large to perform a first peak zone operation or the first chip outputs the first token output signal to the second chip, according to the second token input signal input through the second input terminal of the first chip, and
wherein the second token input signal provided to the first chip includes information regarding whether the second chip performs a second peak zone operation that requires a token and information regarding an amount of a required token to perform the second peak zone operation of the second chip.

2. The semiconductor device according to claim 1, wherein the first chip performs a bypass operation to transfer a token corresponding to the first token input signal to the second chip when the amount of the available token in the first chip is less than that of a required token to perform the first peak zone operation and an amount of the token corresponding to the first token input signal is greater than that of the required token to perform the second peak zone operation.

3. The semiconductor device according to claim 2, further comprising:
a plurality of registers each storing a number of bypass operations performed by a corresponding one of the plurality of chips.

4. The semiconductor device according to claim 3, wherein the first chip performs the bypass operation when the number of bypass operations performed by the first chip is less than a predetermined number, and
wherein the first chip stops performing the bypass operation when the number of bypass operations performed by the first chip reaches the predetermined number.

5. The semiconductor device according to claim 1, wherein the first chip further includes a third input terminal receiving a priority signal of the second peak zone operation of the second chip and a third output terminal outputting a priority signal of the first peak zone operation of the first chip, and the third input terminal of the first chip is coupled to a third output terminal of the second chip.

6. The semiconductor device according to claim 5, wherein, when a priority of the second peak zone operation of the second chip is higher than a priority of the first peak zone operation of the first chip, the first chip waits until the amount of the available token in the first chip becomes sufficiently large to perform the first peak zone operation or the first chip outputs the first token output signal to the second chip, according to the second token input signal.

7. The semiconductor device according to claim 6, wherein, when the priority of the second peak zone operation of the second chip is higher than the priority of the first peak zone operation of the first chip and an amount of a token of the first token input signal is greater than that of the required token to perform the second peak zone operation of the second chip, the first chip performs a bypass operation to transfer the amount of the token of the first token input signal to the second chip.

8. The semiconductor device according to claim 7, further comprising:
a plurality of registers each storing a number of bypass operations performed by a corresponding one of the plurality of chips.

9. The semiconductor device according to claim 8, wherein, the first chip performs the bypass operation when the number of bypass operations performed by the first chip is less than a predetermined number, and
wherein the first chip stops performing the bypass operation when the number of bypass operations performed by the first chip reaches the predetermined number.

10. An operating method of a semiconductor device in which a plurality of chips including a first chip and a second chip is included, the first and second chips coupled to each other in a bi-directional ring structure, the operating method comprising:
comparing an amount of an available token in the first chip with an amount of a required token to perform a first peak zone operation of the first chip;
comparing the amount of the available token in the first chip with an amount of a required token to perform a second peak zone operation of the second chip when the available token in the first chip is less than the required token to perform the first peak zone operation of the first chip; and
transferring a portion of the amount of the available token of the first chip to the second chip and performing the second peak zone operation of the second chip when the amount of the available token in the first chip is greater than the amount of the required token to perform the second peak zone operation of the second chip.

11. The operating method according to claim 10, further comprises:
performing the first peak zone operation of the first chip when the amount of the available token in the first chip is equal to or greater than the amount of the required token to perform the first peak zone operation of the first chip.

12. The operating method of the semiconductor device according to claim 10, further comprises:
waiting until the amount of the available token in the first chip becomes equal to or greater than the amount of the required token to perform the first peak zone operation when the amount of the available token in the first chip is less than the amount of the required token to perform the second peak zone operation of the second chip.

13. The operating method of the semiconductor device according to claim 10, further comprising:
receiving a first token input signal by the first chip; and
comparing a number of bypass operations performed by the first chip with a predetermined number when the available token in the first chip is less than that of the required token to perform the first peak zone operation of the first chip,
wherein comparing the amount of the available token in the first chip with the amount of the required token to perform the second peak zone operation of the second chip is performed when the number of bypass operations is less than the predetermined number, and wherein the first chip waits until the amount of the available token in the first chip becomes equal to or greater than the amount of the required token to perform the first peak zone operation when the number of bypass operations reaches the predetermined number.

14. An operating method of a semiconductor device in which a plurality of chips including a first chip and a second chip is included, the first and second chips coupled to each other in a bi-directional ring structure, the operating method comprising:

comparing a priority of a first peak zone operation of the first chip with a priority of a second peak zone operation of the second chip;

comparing an amount of an available token in the first chip with an amount of a required token to perform the second peak zone operation of the second chip when the priority of the second peak zone operation of the second chip is higher than the priority of the first peak zone operation of the first chip; and transferring a portion of the available token of the first chip to the second chip and performing the second peak zone operation of the second chip when the amount of the available token in the first chip is greater than the amount of the required token to perform the second peak zone operation of the second chip.

15. The operating method of the semiconductor device according to claim 14, further comprising:

determining whether or not to perform the first peak zone operation of the first chip according to the amount of the available token in the first chip when the priority of the second peak zone operation of the second chip is equal to or lower than the priority of the first peak zone operation of the first chip.

16. The operating method of the semiconductor device according to claim 14, further comprising:

waiting until the amount of the available token in the first chip becomes equal to or greater than the amount of the required token to perform the first peak zone operation when the amount of the available token in the first chip is less than the amount of the required token to perform the second peak zone operation of the second chip.

17. The operating method of the semiconductor device according to claim 14, further comprising:

receiving a first token input signal by the first chip; and comparing a number of bypass operations performed by the first chip with a predetermined number when the priority of the second peak zone operation of the second chip is higher than the priority of the first peak zone operation of the first chip, wherein comparing the amount of the available token in the first chip with the amount of the required token to perform the second peak zone operation of the second chip is performed when the number of bypass operations performed by the first chip is less than the predetermined number, and wherein the first chip waits until the amount of the available token in the first chip becomes equal to or greater than the amount of the required token to perform the first peak zone operation when the number of bypass operations reaches the predetermined number.

* * * * *